United States Patent [19]

Snelten

[11] Patent Number: 5,302,901
[45] Date of Patent: Apr. 12, 1994

[54] MAGNETIC RESONANCE APPARATUS COMPRISING DECOUPLED RECEIVER COILS

[75] Inventor: Jeroen Snelten, Eindhoven, Netherlands

[73] Assignee: U.S Philips Corporation, New York, N.Y.

[21] Appl. No.: 932,870

[22] Filed: Aug. 20, 1992

[30] Foreign Application Priority Data

Aug. 26, 1991 [EP] European Pat. Off. ......... 91202168.0

[51] Int. Cl.⁵ .................................................. G01R 33/20
[52] U.S. Cl. ...................................... 324/322; 324/318
[58] Field of Search ............... 324/322, 318, 307, 309, 324/313, 314

[56] References Cited

U.S. PATENT DOCUMENTS

| | | | |
|---|---|---|---|
| 4,620,155 | 10/1986 | Edelstein | 324/322 |
| 4,769,605 | 9/1988 | Fox | 324/322 |
| 4,812,764 | 3/1989 | Bendall | 324/318 |
| 4,816,765 | 3/1989 | Boskamp | 324/318 |
| 4,952,879 | 8/1990 | Van Vaals et al. | 324/322 |
| 4,998,066 | 3/1991 | Wiechern et al. | 324/322 |

FOREIGN PATENT DOCUMENTS 0175129 3/1986 European Pat. Off. .
3905564 9/1990 Fed. Rep. of Germany .

*Primary Examiner*—Louis Arana
*Attorney, Agent, or Firm*—Jack D. Slobod

[57] ABSTRACT

Magnetic resonance apparatus includes an RF receiver coil system (13, 15) for detecting magnetic resonance signals generated in an object. This RF receiver coil system has a first (35) and a second receiver coil (37) which could be coupled to one another by mutual inductance. In order to compensate for the mutual inductance there is provided a decoupling network. This network has a first (49) and a second terminal (51) which are connected to a first end and a second end, respectively, of the first receiver coil (35), and also a third (53) and a fourth terminal (55) which are connected to a first end and a second end, respectively, of the second receiver coil (37). The decoupling network contains a first circuit (57) of variable impedance which interconnects the first and the third terminal (49, 53) and also a second circuit (59) of variable impedance which interconnects the second and the fourth terminal (51, 55). Each of the first and second circuits (57, 59) have at least one capacitor (63) and at least one coil (61), the value of the capacitor and/or the coil being variable so as to enable variation of the impedance of the circuits.

12 Claims, 2 Drawing Sheets 5,302,901

MAGNETIC RESONANCE APPARATUS COMPRISING DECOUPLED RECEIVER COILS

BACKGROUND OF THE INVENTION

Field of the Invention

The invention relates to a magnetic resonance apparatus, including a magnet system for generating a steady magnetic field, a coil system for generating a gradient field, an RF transmitter coil, and an RF receiver coil system for detecting magnetic resonance signals generated in an object, which RF receiver coil system has two receiver coils which could be coupled to one another by mutual inductance, a four terminal decoupling network connected to the ends of the two receiver coils being provided to compensate for the mutual inductance, which network contains a first circuit of variable impedance which is connected between first ends of the two receiver coils and a second circuit of variable impedance which is connected between second coils of the two receiver coils. The invention also relates to an RF receiver coil system suitable for use in such an apparatus.

An example of a magnetic resonance apparatus of this kind is known from U.S. Pat. No. 4,769,605. In the known device, the first and the second circuit can each be formed by a variable capacitor. The decoupling network is then very simple and inexpensive, but also has a number of practical drawbacks. A first drawback, mentioned in U.S. Pat. No. 4,769,605, consists in that first and second variable capacitors comprising the first and second circuit, respectively, should have a very small value, for example less than 1 pF, and that it is particularly difficult to accurately manufacture variable capacitors of such a low value. Moreover, these two capacitors should be simultaneously varied, thus increasing the difficulties. Instead of the simple decoupling network comprising only two capacitors, therefore, preferably a much more complex network comprising at least five capacitors is used. A further complication arises because the polarity of any coupling due to the mutual inductance between the receiver coils often is not known in advance. Therefore, the decoupling network must be suitable to compensate for positive as well as negative mutual inductance. The cited document states two methods to achieve this object. In accordance with the first method, the decoupling network is connected to the coils via switches, so that the connections of the network to the coils can be interchanged in the event of a different polarity of the mutual inductance. In accordance with the second method, a very complex decoupling network consisting of at least ten capacitors is used. It will be evident that both methods lead to complex, expensive and vulnerable decoupling networks.

SUMMARY OF THE INVENTION

It is an object of the invention to provide a magnetic resonance apparatus of the kind set forth in which an undesirable coupling due to a mutual inductance between the receiver coils can be compensated for by employing very simple means, regardless of the polarity of the mutual inductance. To achieve this, the device in accordance with the invention is characterized in that each of the first and second circuits also comprises at least one coil.

The invention is based on the idea that a positive mutual inductance can be compensated for when the impedance of the first and the second circuit is capacitive and that a negative mutual inductance can be compensated for when this impedance is inductive. Because the first and the second circuits comprise coils as well as capacitors, it is simply possible to control their impedances so that either the coils or the capacitors decide the nature of the resultant impedance.

A preferred embodiment of the device in accordance with the invention is characterized in that each of the first and second circuits consists of a parallel connection of at least one coil and a capacitor. This embodiment offers the advantage that it can be very simply manufactured using only few components.

The control of the impedance of the first and the second circuit is very simple and accurate in an embodiment which is characterized in that each of the first and second circuits comprises a variable capacitor, said variable capacitors comprising control members which are coupled to one another. The same advantages are achieved in a further embodiment which is characterized in that each of the first and second circuits comprises a variable coil, which variable coils comprise control members which are coupled to one another. It is to be noted that, generally speaking, variable capacitors are slightly simpler and less expensive than variable coils, notably when these coils are to be provided with an RF shield and/or should have a very high quality factor Q. Therefore, the first one of the latter two embodiments is to be preferred.

Another embodiment of the device in accordance of the invention is characterized in that the first receiver coil is formed as a butterfly coil, the second receiver coil being formed as a substantially flat coil. The butterfly coil can then serve to receive horizontally oriented RF magnetic fields and the flat coil, which may have an arbitrary shape and which may be, for example, a single flat coil, can serve to receive vertically oriented RF magnetic fields. Such a combination of receiver coils offers the advantage that the coupling due to mutual inductance can be minimized by suitable (symmetrical) mutual positioning of the two receiver coil as is known per se from EP-B-274 773, which corresponds to commonly owned U.S. Pat. No. 4,816,765.

These and other aspects of the invention will be described in detail hereinafter with reference to the drawing.

DETAILED DESCRIPTION OF THE PREFERRED EMBODIMENTS

Figure 1:
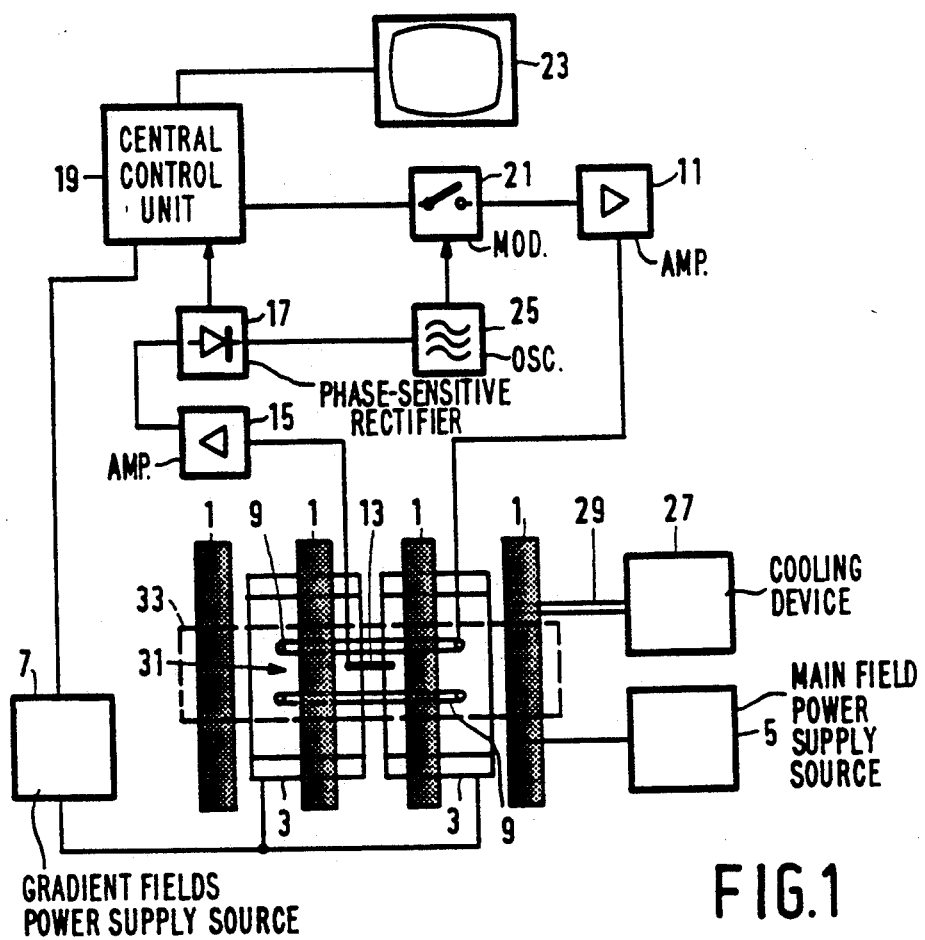
FIG. 1 shows diagrammatically an embodiment of a magnetic resonance apparatus in accordance with the invention.

A magnetic resonance apparatus as shown diagrammatically in FIG. 1 comprises a magnet system 1 for generating a steady, uniform main magnetic field, a magnet system 3 for generating magnetic gradient fields, and power supply sources 5 and 7 for the magnet system 1 and the magnet system 3, respectively. A magnet coil system 9 serves to generate an RF magnetic alternating field (referred to hereinafter as RF transmitter coil) and is connected to an RF source 11. For detection of magnetic resonance signals generated by the RF transmitter field in an object to be examined, there is included an RF receiver coil system 3. The coil system 13 is connected to signal amplifier means 15 for the purpose of reading out. The signal amplifier means 15 are connected to a phase-sensitive rectifier 17 which is connected to a central control unit 19. The central control unit 19 also controls a modulator 21 for the RF source 11, the power supply source 7 for the gradient coils 3, and a monitor 23 for display. An RF oscillator 25 controls the modulator 21 as well as the phase-sensitive rectifier 17 which processes the measurement signals. For cooling, if any, there is provided a cooling device 27 which comprises cooling ducts 29. A cooling device of this kind may be constructed as a water cooling system for resistive coils or as a liquid nitrogen or helium dewar system for superconducting coils. The RF transmitter coil, 9, being arranged within the magnet systems 1 and 3, encloses a measurement space 31 which is spacious enough to accommodate a patient in the case of an apparatus for medical diagnostic measurements. Thus, a steady magnetic field, gradient fields for position selection of slices to be imaged, and a spatially uniform RF alternating field can be generated within the measurement space 31. The measurement space 31 is shielded against interference fields by a Faraday cage 33.

Figure 2:
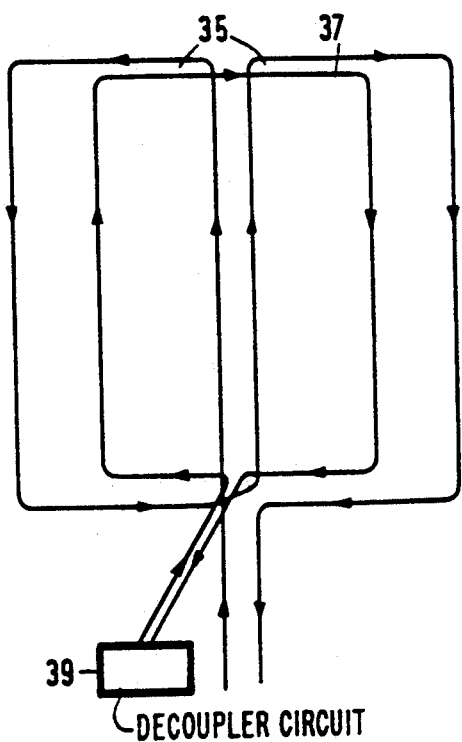
FIG. 2 shows an embodiment of a set of RF receiver coils for use in the apparatus shown in FIG. 1.

FIG. 2 shows diagrammatically an embodiment of a quadrature surface coil system forming part of the RF receiver coil system 13. It consists of a first receiver coil 35 in the form of a butterfly coil and a second receiver coil 37 in the form of a single, flat coil. The butterfly coil 35 is uncoupled, by way of the geometry, for the transmitter field to be used, but because this does not hold for the flat coil 37, a decoupler circuit 39 is added thereto. The circumferential shape of the coils 35, 37 can be chosen at random and may also be, for example substantially circular or elliptical. For a more detailed description of this surface coil system 35, 37, reference is made to the cited document EP-B-274 773 (U.S. Pat. No. 4,816,765) which also describes other combinations of first and second receiver coils, suitable for use in the apparatus shown in FIG. 1. The cited document also explains that from the point of view of symmetry, and hence a minimum risk of coupling by mutual inductance between the coils 35, 37, it is attractive to distribute the surface of the single, flat coil 37 as uniformly as possible between the two halves of the composite coil 35 (butterfly coil). However, it is found in practice that the exact desired position of the two coils relative to one another cannot always be realized. Therefore, there is always a risk of a small residual coupling between the two coils 35, 37. It cannot be predicted whether this residual coupling will be positive or negative. If no steps were taken to compensate for this residual coupling, the signal-to-noise ratio of the circuit 13, 15, 17 in which the coils 35, 37 are included would be degraded.

Figure 3:
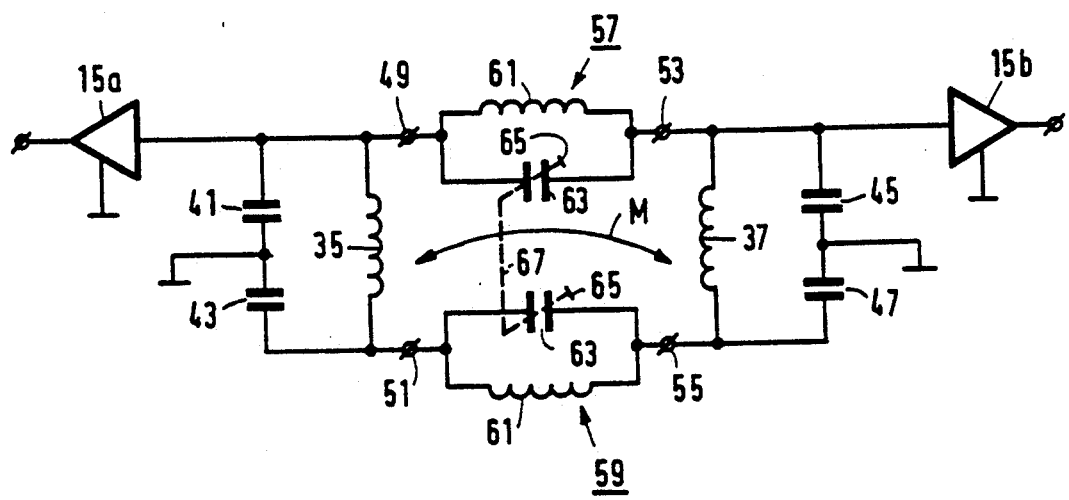
FIG. 3 shows a first embodiment of a circuit of an RF receiver coil system for use in the apparatus shown in FIG. 1.

FIG. 3 shows the parts of a first embodiment of a circuit of an RF receiver coil system for an apparatus as shown in FIG. 1 which are of importance for a suitable understanding of the invention. The first receiver coil 35 constitutes first resonant circuit in conjunction with a series connection of two capacitors 41, 43, a first end of the coil being connected to the capacitor 41 and a second end being connected to the capacitor 43. In conjunction with a series connection of two capacitors 45, 47, the second receiver coil 37 constitutes a second resonant circuit, a first end of the coil being connected to the capacitor 45 and a second end being connected to the capacitor 47. The junction of the capacitors 41 and 43 and the junction of the capacitors 45 and 47 are connected to ground in the present embodiment. However, this is not necessary to achieve a satisfactory effect of the invention. The first end of the first receiver coil 35 is connected to a first amplifier 15a and the first end of the second receiver coil 37 is connected to a second amplifier 15b. If desirable, the second amplifier 15b may be connected to the second end of the second receiver coil 37 instead of to the first end of this coil. The amplifiers 15a and 15b together constitute the signal amplifier means 15. As has already been explained, a mutual inductance M (denoted by a double arrow) may exist between the two receiver coils 35 and 37, so that the coils are undesirably coupled to one another. In order to compensate for this mutual inductance there is provided a decoupling network which comprises a first and a second terminal 49, 51 which are connected to the first and the second end, respectively, of the first receiver coil 35, and a third and a fourth terminal 53, 55 which are connected to the first and the second end, respectively, of the second receiver coil 37. The decoupling network comprises a first circuit 57 which connects the first terminal 49 to the third terminal 53 and a second circuit 59 which connects the second terminal 51 to the fourth terminal 55. Each of the first and second circuits 57, 59 has a variable impedance. In the embodiment shown in FIG. 3, each of the first and second circuits 57, 59 consists of a parallel connection of a coil 61 and a capacitor 63. The coils 61 are identical, like the capacitors 63. Each of the capacitors 63 is variable so as to enable variation of the impedance of the circuits 57, 59. To this end, each of the capacitors 63 comprises a control member 65, the two control members being coupled to one another as denoted by a dashed line 67. Control may be mechanical or electrical.

Figure 4:
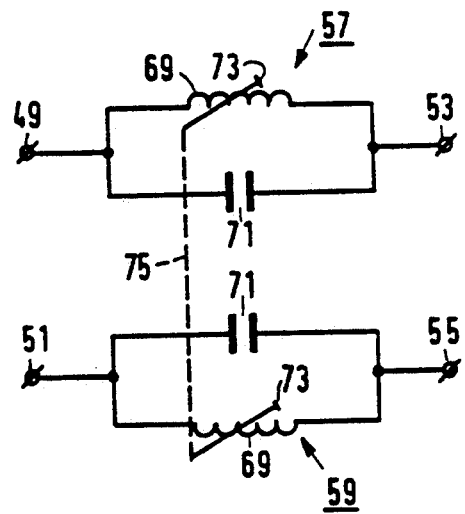
FIG. 4 shows a detail of a second embodiment of such a circuit.

FIG. 4 shows a decoupling network for a second embodiment of a circuit of the RF receiver coil system for the apparatus shown in FIG. 1. Corresponding components are denoted by the same reference numerals as used in FIG. 3. The decoupling network shown in FIG. 4 can be used instead of the decoupling network shown in FIG. 3, the other parts of the circuit, having been omitted in FIG. 4 for the sake of simplicity, may be the same as in FIG. 3. In the decoupling network shown in FIG. 4, each of the first and second circuits 57 and 59 consists of a parallel connection of a coil 69 and a capacitor 71. In the present embodiment the coils 69 are constructed so as to be variable and the capacitors 71 are constructed so as to be fixed. Each of the coils 69 comprises a control member 73, the control members being coupled to one another as denoted by a dashed line 75.

The operation of the decoupling networks will be briefly described hereinafter. The first and the second circuit 57, 59 constitute, in conjunction with the series connection of the capacitors 45 and 47, a voltage divider so that a small part of the voltage $V_{35}$ across the first receiver coil 35 will be present across the second receiver coil 37. This part $V'_{37}$ is approximately equal to:

$$V_{37}' = \frac{Z_2}{Z_k + Z_2} V_{35}$$

Therein, $Z_2$ is the impedance of the series connection of the capacitors 45 and 47 and $Z_k$ is the impedance of the series-connected first and second circuits 57, 59 of the coupling network. The coupling network thus introduces an additional coupling between the receiver coils 35 and 37 which can be represented by an additional coupling factor k':

$$k' = \frac{V_{37}'}{V_{35}} = \frac{Z_2}{Z_k + Z_2}$$

Because $Z_2$ is capacitive, it will be evident that k' will be positive if $Z_k$ is mainly capacitive (which means that the influence of the capacitor in the circuits 57 and 59 is predominant), and will be negative if $Z_k$ is mainly inductive (which means that the influence of the coil is predominant). Thus, variation of $Z_k$ enables a choice between the compensation of a positive or a negative coupling due to the mutual inductance M between the receiver coils 35 and 37.

In the embodiments described with reference to the FIGS. 3 and 4, each of the first and second circuits 57, 59 consists of one coil 61 or 69 and one capacitor 63 or 71. This is the simplest and least expensive solution. However, it will be evident that it is alternatively possible to use networks comprising more components for these circuits.

The use of the invention is not restricted to the decoupling of coils 35, 37 as shown in FIG. 2. It is equally well possible to decouple coils of a different construction, for example the coils described in DE-A-3 905 564.

I claim:

1. A magnetic resonance apparatus comprising a magnet system for generating a steady magnetic field, a coil system for generating a gradient field, an RF transmitter coil, and an RF receiver coil system for detecting magnetic resonance signals generated in an object, which RF receiver coil system comprises first and second receiver coils which are coupled to one another by an unwanted coupling due to mutual inductance, and a decoupling network means for producing a compensation coupling between said first and second coils which is opposite in sign and substantially equal in magnitude to said unwanted coupling due to mutual inductance, which network means comprises first and second terminals which are connected to opposite ends, respectively, of the first receiver coil and third and fourth terminals which are connected to opposite ends, respectively, of the second receiver coil, said decoupling network means comprising a first circuit of variable impedance which interconnects the first and third terminals and a second circuit of variable impedance which interconnects the second and fourth terminals, said first and second circuits being variable in impedance over a range including both inductive and capacitive reactance such that the compensation coupling produced by said decoupling network means is variable in both sign and magnitude.

2. A magnetic resonance apparatus as claimed in claim 1, wherein the first and second circuits comprise respective parallel connected circuits, each having a respective coil and a respective capacitor.

3. A magnetic resonance apparatus as claimed in claim 2, wherein the first receiver coil is a butterfly coil and the second receiver coil is a substantially flat coil.

4. A magnetic resonance apparatus as claimed in claim 2, wherein the respective capacitors comprised by the first and second circuits are variable and have respective control members which are coupled to one another.

5. A magnetic resonance apparatus as claimed in claim 2, wherein the respective coils comprised by the first and second circuits are variable and have respective control members which are coupled to one another.

6. A magnetic resonance apparatus as claimed in claim 1, wherein the first receiver coil is a butterfly coil and the second receiver coil is a substantially flat coil.

7. An RF receiver coil system suitable for use in a magnetic resonance apparatus, which RF receiver coil system comprises first and second receiver coils which are coupled to one another by an unwanted coupling due to mutual inductance, and a decoupling network means for producing a compensation coupling between said first and second coils which is opposite in sign and substantially equal in magnitude to said unwanted coupling due to mutual inductance, which network means comprises first and second terminals which are connected to opposite ends, respectively, of the first receiver coil and third and fourth terminals which are connected to opposite ends, respectively, of the second receiver coil, said decoupling network means comprising a first circuit of variable impedance which interconnects the first and third terminals and a second circuit of variable impedance which interconnects the second and fourth terminals, said first and second circuits being variable in impedance over a range that includes both inductive and capacitive reactance such that the compensation coupling produced by said decoupling network means is variable in both sign and magnitude.

8. An RF receiver coil system as claimed in claim 7, wherein the first and second circuits comprise respective parallel connected circuits, each having a respective coil and a respective capacitor.

9. An RF receiver coil system as claimed in claim 8, wherein the first receiver coil is a butterfly coil and the second receiver coil is a substantially flat coil.

10. An RF receiver coil system as claimed in claim 8, wherein the respective capacitors comprised by the first and second circuits are variable and have respective control members which are coupled to one another.

11. An RF receiver coil system as claimed in claim 8, wherein the respective coils comprised by the first and second circuits are variable and have respective control members which are coupled to one another.

12. An RF receiver coil system as claimed in claim 6, wherein the first receiver coil is a butterfly coil and the second receiver coil is a substantially flat coil.

* * * * *